United States Patent
Lee et al.

(10) Patent No.: US 9,725,798 B2
(45) Date of Patent: Aug. 8, 2017

(54) APPARATUS FOR MANUFACTURING DISPLAY DEVICE AND METHOD OF MANUFACTURING DISPLAY DEVICE

(71) Applicant: Samsung Display Co., Ltd., Yongin, Gyeonggi-Do (KR)

(72) Inventors: Suhwan Lee, Yongin (KR); Eunho Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/598,027

(22) Filed: Jan. 15, 2015

(65) Prior Publication Data
US 2016/0032441 A1    Feb. 4, 2016

(30) Foreign Application Priority Data
Aug. 4, 2014    (KR) .......... 10-2014-0099970

(51) Int. Cl.
*C23C 4/12* (2016.01)
*H01J 37/32* (2006.01)

(52) U.S. Cl.
CPC ........ *C23C 4/127* (2013.01); *H01J 37/32366* (2013.01); *H01J 37/32385* (2013.01); *H01J 37/32449* (2013.01); *H01J 37/32623* (2013.01); *H01J 37/32743* (2013.01)

(58) Field of Classification Search
CPC .............. C23C 4/127; H01J 37/32366; H01J 37/32385
See application file for complete search history.

(56) References Cited

U.S. PATENT DOCUMENTS

| 2007/0257289 A1* | 11/2007 | Yang ................... H01L 27/1214 257/296 |
| 2008/0050923 A1* | 2/2008 | Kim .................. H01L 21/02087 438/706 |
| 2010/0144154 A1* | 6/2010 | Komuro ............ H01L 21/67069 438/700 |

FOREIGN PATENT DOCUMENTS

| JP | 2007-227315 A | 9/2007 |
| KR | 10-2006-0101324 A | 9/2006 |
| KR | 10-2007-0097859 A | 10/2007 |
| KR | WO 2011030966 A1 * | 3/2011 ........ H01J 37/32091 |

OTHER PUBLICATIONS

Translated Abstract for WO 2011030966 A1 (2011), 2 pages.*

* cited by examiner

*Primary Examiner* — Nadine Norton
*Assistant Examiner* — Mahmoud Dahimene
(74) *Attorney, Agent, or Firm* — Knobbe Martens Olson & Bear LLP (57) ABSTRACT

An apparatus for manufacturing a display device and a method of manufacturing a display device is disclosed. In one aspect, the apparatus includes a guider configured to guide a substrate on which a display portion is formed, a plasma sprayer configured to be spaced apart from the display portion and configured to spray plasma onto the substrate and a mask configured to be arranged over the substrate and cover the display portion. The mask includes a body portion configured to face the display portion and a protrusion portion formed at an end of the body portion and configured to extend towards the substrate.

8 Claims, 5 Drawing Sheets

APPARATUS FOR MANUFACTURING DISPLAY DEVICE AND METHOD OF MANUFACTURING DISPLAY DEVICE

CROSS-REFERENCE TO RELATED APPLICATIONS

This application claims the benefit of Korean Patent Application No. 10-2014-0099970, filed on Aug. 4, 2014, in the Korean Intellectual Property Office, the disclosure of which is incorporated herein in its entirety by reference.

BACKGROUND

Field

The described technology generally relates to an apparatus for manufacturing a display device and a method of manufacturing the display device.

Description of the Related Technology

Electronic devices designed for mobility are being widely used. Among mobile electronic devices, tablet PCs are currently widely used in addition to small electronic devices such as mobile phones.

To provide various functions, the mobile electronic devices include display devices for providing visual information, such as images or videos, to users. With the miniaturization of various components for driving display devices, the importance of display devices in electronic devices is increasing.

Display devices may be formed as having various structures. Here, display devices may include a substrate, a display portion, an encapsulating substrate encapsulating the display portion, and a sealing member sealing between the encapsulating substrate and the substrate. Here, according to an adhesive strength of the sealing member, adhesion of the encapsulating substrate and the substrate may be determined.

SUMMARY OF CERTAIN INVENTIVE ASPECTS

One inventive aspect is an apparatus for manufacturing a display device which includes: a guide unit in which a substrate on which a display portion is formed is guided; a plasma spraying unit spaced apart from the display portion and spraying plasma onto the substrate; and a mask arranged on the substrate and covering the display portion, wherein the mask includes: a body portion facing the display portion; and a protrusion portion formed at an end of the body portion to protrude towards the substrate.

The protrusion portion may be formed to wrap an edge of the body portion.

The protrusion portion may be formed to be inclined from the body portion.

The protrusion portion may be formed to be more distanced apart from the body portion, in order from the body portion to the substrate.

The protrusion portion may be combined with the body portion to be detachable.

The protrusion portion may be formed of a flexible material.

A surface of the protrusion portion may be coated with fluorine.

The apparatus may further include a chamber in which the guide unit, the plasma spraying unit, and the mask are arranged.

The apparatus may further include a pressure adjusting unit connected to the chamber and controlling an inner pressure of the chamber.

The apparatus may further include a location determination unit determining locations of the substrate and the mask.

Another aspect is a method of manufacturing a display device which includes: inserting a substrate on which a display portion is formed on a display area into a chamber; and etching a non-display area of the substrate by spraying plasma onto the substrate after arranging a mask on the display area, wherein the plasma is prevented from flowing into a space between the substrate and the mask.

The mask may include: a body portion arranged on the display area; and a protrusion portion formed to protrude towards the substrate from the body portion to prevent the plasma from flowing into the space between the substrate and the body portion.

The protrusion portion may be formed of a flexible material. The method may further include aligning the mask and the substrate. The etching of the non-display area may be performed in a vacuum state. The method may further include forming an opposite electrode in the display area.

Another aspect is an apparatus for manufacturing a display device, the apparatus comprising: a guider configured to guide a substrate on which a display portion is formed; a plasma sprayer configured to be spaced apart from the display portion and configured to spray plasma onto the substrate; and a mask configured to be arranged over the substrate and cover the display portion, wherein the mask comprises: a body portion configured to face the display portion; and a protrusion portion formed at an end of the body portion and configured to extend towards the substrate.

In the above apparatus, the protrusion portion at least partially surrounds an edge of the body portion. In the above apparatus, the protrusion portion is inclined with respect to the body portion. In the above apparatus, the protrusion portion more distanced apart from the body portion, in order from the body portion to the substrate. In the above apparatus, the protrusion portion is combined with the body portion to be detachable. In the above apparatus, an insertion groove is formed in one of the body portion and the protrusion portion, and wherein an insertion protrusion is formed on the other of the body portion and the protrusion portion. In the above apparatus, the protrusion portion is formed of a flexible material. In the above apparatus, a surface of the protrusion portion is coated with fluorine.

The above apparatus further comprises a chamber configured to accommodate the guider, the plasma sprayer, and the mask. The above apparatus further comprises a pressure adjuster connected to the chamber and configured to control an inner pressure of the chamber. The above apparatus further comprises a location determination device located inside the chamber and configured to determine locations of the substrate and the mask. In the above apparatus, at least a portion of the plasma sprayer is located outside the chamber. In the above apparatus, the height of the protrusion portion is greater than that of the body portion, and wherein the height is measured in a direction substantially perpendicular to the display portion. In the above apparatus, the protrusion portion has a cross-sectional surface which has a substantially triangular, oval, or circular shape.

Another aspect is a method of manufacturing a display device, the method comprising: inserting a substrate on which a display portion is formed on a display area into a chamber; placing a mask over the display area; and spraying plasma onto the substrate so as to etch a non-display area of the substrate, wherein the plasma is substantially prevented from flowing into a space between the substrate and the mask.

In the above method, the mask comprises: a body portion arranged over the display area; and a protrusion portion extending towards the substrate from the body portion to substantially prevent the plasma from flowing into the space between the substrate and the body portion. In the above method, the protrusion portion has a cross-sectional surface which has a substantially triangular, oval, or circular shape. In the above method, an insertion groove is formed in one of the body portion and the protrusion portion, and wherein an insertion protrusion is formed on the other of the body portion and the protrusion portion. In the above method, the protrusion portion is formed of a flexible material. In the above method, the etching of the non-display area is performed in a vacuum state.

DETAILED DESCRIPTION OF CERTAIN INVENTIVE EMBODIMENTS

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Figure 1:
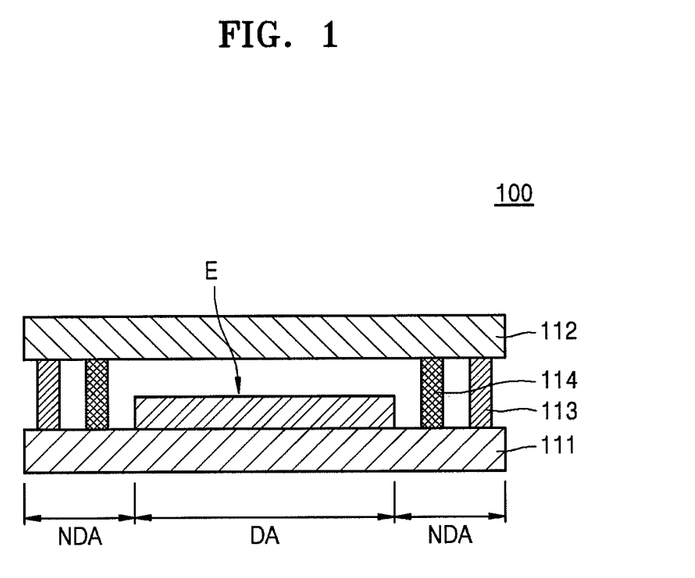
FIG. 1 is a cross-sectional view of a display device which is manufactured by an apparatus for manufacturing a display device according to an embodiment.
Figure 2:
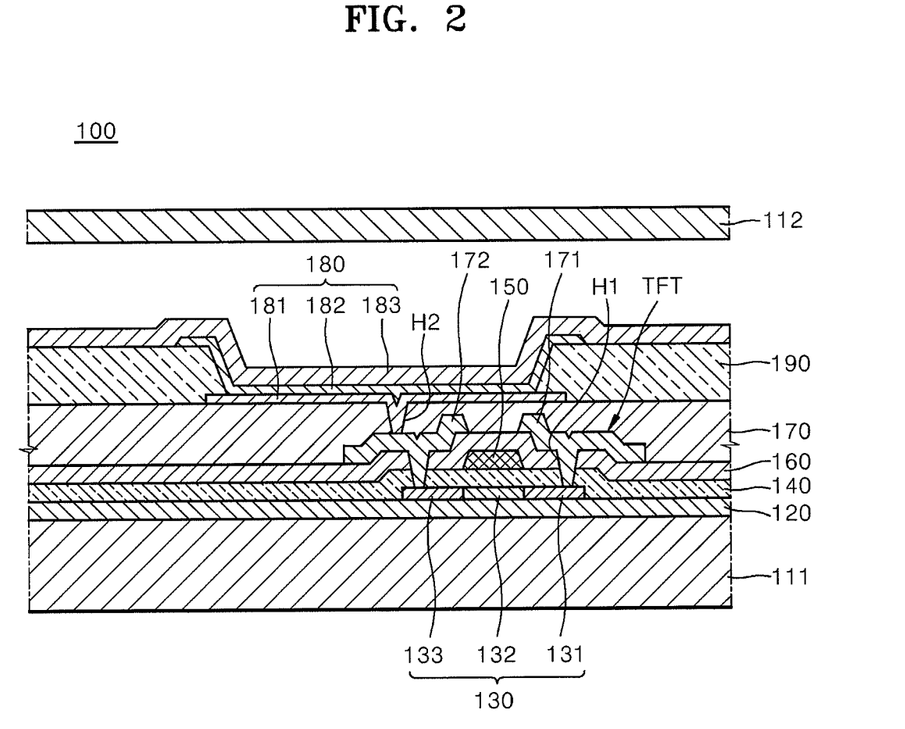
FIG. 2 is a cross-sectional view of a portion of a display area illustrated in FIG. 1.

FIG. 1 is a cross-sectional view of a display device 100 which is manufactured by an apparatus for manufacturing a display device according to an embodiment. FIG. 2 is a cross-sectional view of a portion of a display area illustrated in FIG. 1.

Referring to FIGS. 1 and 2, the display device 100 includes a substrate 111 and a display portion E. Also, the display device 100 includes an encapsulating substrate 112 formed over the display portion E. Here, the encapsulating substrate 112 can be the same or substantially the same as a general encapsulating substrate used in a display device, and thus, its detailed description will be omitted.

The display device 100 includes a sealing member 113 formed on the substrate 111 and the encapsulating substrate 112. Here, the sealing member 113 can be the same or substantially the same as a general sealing member which attaches the substrate 111 to the encapsulating substrate 112 to substantially seal the display portion E, and thus, its detailed description will be omitted.

The display device 100 includes a getter 114 arranged between the substrate 111 and the encapsulating substrate 112. Here, the getter 114 can be the same or substantially the same as a general material which absorbs water or oxygen, and thus, its detailed description will be omitted.

The display device 100 is divided into a display area DA in which the display portion E is formed and a non-display area NDA in which the display portion E is not formed.

The display portion E is formed on the substrate 111. Here, a thin film transistor TFT and a passivation layer 170 to cover the TFT and the display portion E may be formed in the display portion E, and an organic light-emitting device 180 may be formed on the passivation layer 170.

Here, the substrate 111 may be formed of a glass material. However, it is not limited thereto and the substrate 111 may be formed of a plastic material, or a metal material such as SUS and Ti. Also, the substrate 111 may be formed of polyimide (PI). Hereinafter, the case in which the substrate 111 is formed of the glass material will be described in detail for convenience of explanation.

A buffer layer 120 formed of an organic compound and/or an inorganic compound is further formed on the substrate 111. The buffer layer 120 may be formed of $SiO_x$ ($x \geq 1$) or $SiN_x$ ($x \geq 1$).

An active layer 130 which is arranged as predetermined patterns is formed on the buffer layer 120, and then, the active layer 130 is buried by a gate insulating layer 140. The active layer 130 has a source region 131 and a drain region 133, and further includes a channel region 132 between the source region 131 and the drain region 133.

The active layer 130 may be formed to include various materials. For example, the active layer 130 may include an inorganic semiconductor material, such as amorphous silicon or crystalline silicon. According to another embodiment, the active layer 130 includes an oxide semiconductor. According to another embodiment, the active layer 130 includes an organic semiconductor material. However, hereinafter, the case in which the active layer 130 is formed of amorphous silicon will be described in detail, for convenience of explanation.

The active layer 130 may be formed by forming an amorphous silicon layer on the buffer layer 120, crystallizing the amorphous silicon layer to form a polycrystalline silicon layer, and patterning the polycrystalline silicon layer. The source region 131 and the drain region 133 of the active layer 130 can be doped with impurities, according to the type of the TFT, such as a driving TFT (not shown) and a switching TFT (not shown).

A gate electrode 150 corresponding to the active layer 130 and an interlayer insulating layer 160 burying the gate electrode 150 are formed on the gate insulating layer 140.

Also, after a contact hole H1 is formed in the interlayer insulating layer 160 and the gate insulating layer 140, a source electrode 171 and a drain electrode 172 are formed on the interlayer insulating layer 160 to respectively contact the source region 131 and the drain region 133.

The passivation layer 170 is formed over the TFT which is formed as shown above, and a pixel electrode 181 of the organic light-emitting device (OLED) is formed above the passivation layer 170. The pixel electrode 181 contacts the drain electrode 172 of the TFT by a via-hole H2 formed on the passivation layer 170. The passivation layer 170 may be formed as a single layer or multiple layers by using an inorganic material and/or an organic material. The passivation layer 170 may be formed as a planarization layer to planarize an upper surface of a lower layer below the passivation layer 170, regardless of a curve of the lower layer, or may be formed to adapt to the curve. The passivation layer 170 can be formed as a transparent insulator to achieve a resonance effect.

After the pixel-electrode 181 is formed on the passivation layer 170, a pixel-defining layer 190 can be formed of an organic material and/or an inorganic material to cover the pixel electrode 181 and the passivation layer 170. The pixel-defining layer 190 has an opening to expose the pixel electrode 181.

Also, an intermediate layer 182 and an opposite electrode 183 are formed at least on the pixel electrode 181.

The pixel electrode 181 functions as an anode electrode and the opposite electrode 183 functions as a cathode electrode. Of course, the polarities of the pixel electrode 181 and the opposite electrode 183 may be switched.

The pixel electrode 181 and the opposite electrode 183 are insulated from each other by the intermediate layer 182. Voltages of different polarities are applied to the intermediate layer 182 so that an organic emission layer emits light.

The intermediate layer 182 may include the organic emission layer. According to another selective embodiment, the intermediate layer 182 includes the organic emission layer, and may further include at least one selected from a hole injection layer (HIL), a hole transport layer (HTL), an electron transport layer (ETL), and an electron injection layer (EIL).

A unit pixel includes a plurality of sub-pixels. The sub-pixels may emit various light colors. For example, the sub-pixels may include the sub-pixels respectively emitting red, green, and blue light colors. Alternatively, the sub-pixels may include the sub-pixels (not shown) emitting red, green, blue, and white light colors.

Each of the sub-pixels may include the intermediate layer 182 including an organic emission layer emitting a different light color. For example, each of the plurality of sub-pixels includes the intermediate layer 182 including the organic emission layer emitting red, green, or blue light color.

Hereinafter, an apparatus for manufacturing a display device (not shown) and a method of manufacturing the display device 100 by using the apparatus for manufacturing the display device will be described in detail.

Figure 3:
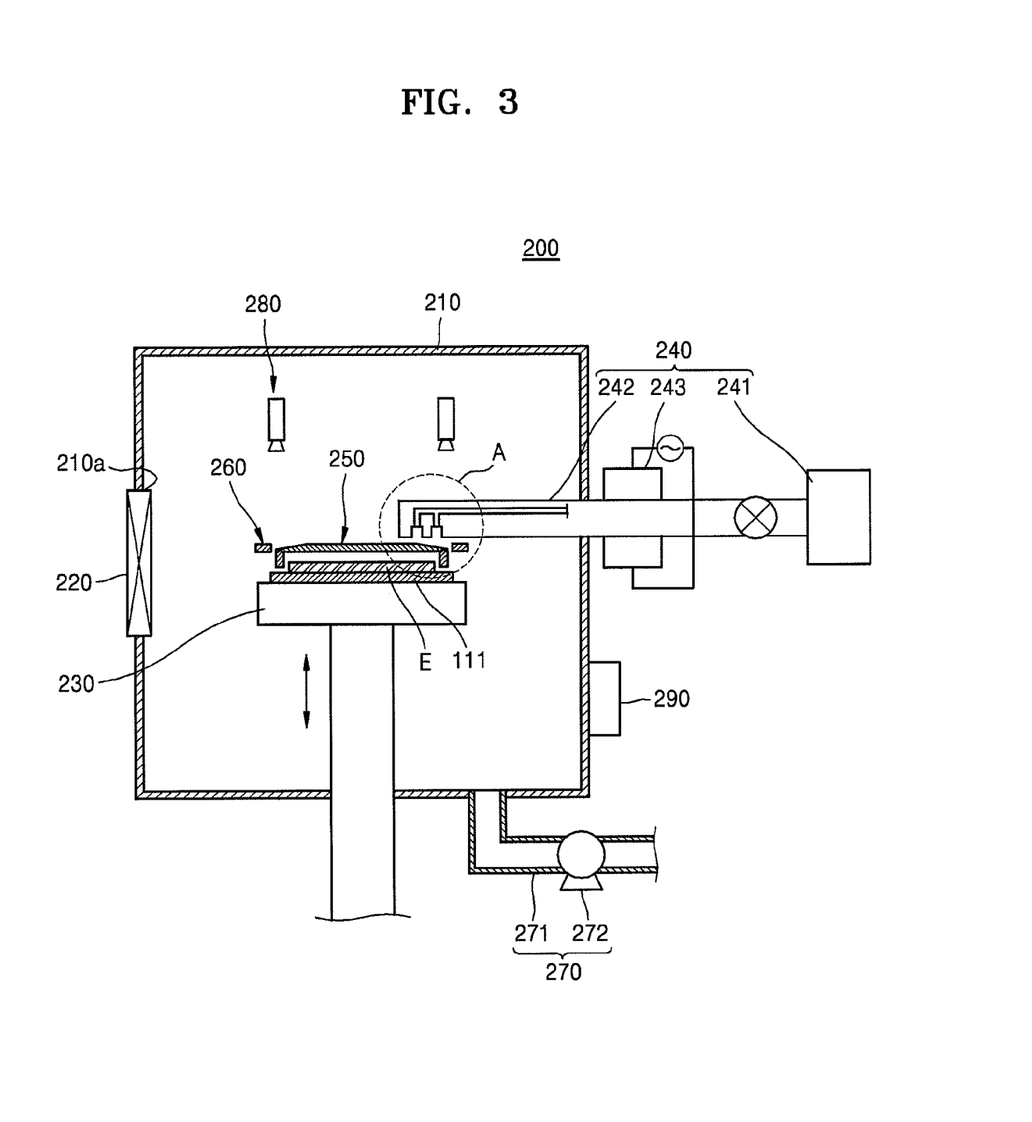
FIG. 3 is a conceptual view of an apparatus for manufacturing a display device according to an embodiment.
Figure 4:
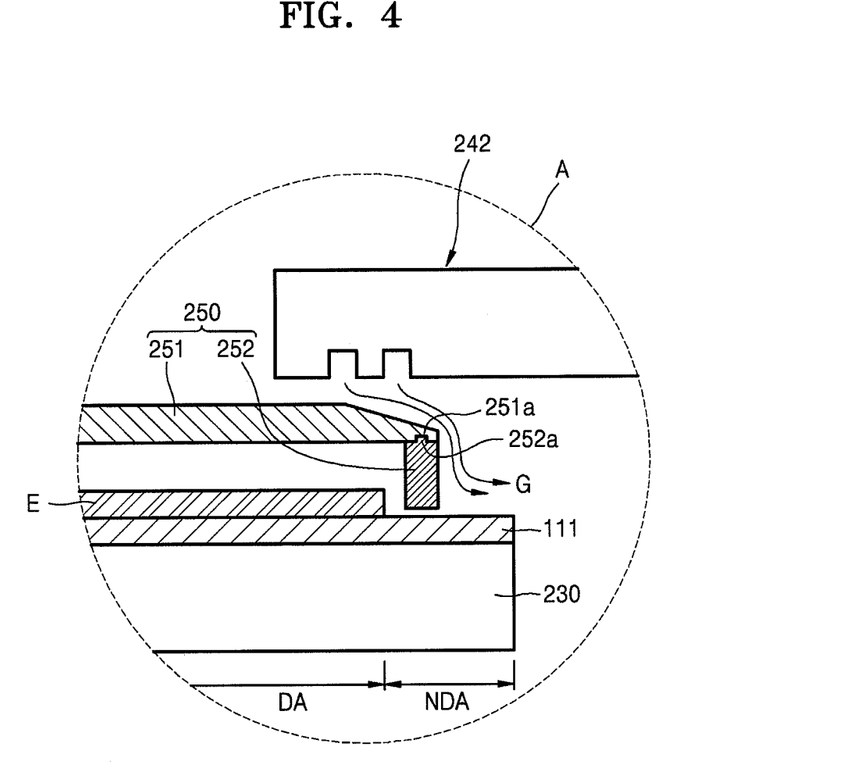
FIG. 4 is an enlarged cross-sectional view of portion A illustrated in FIG. 3.
Figure 5:
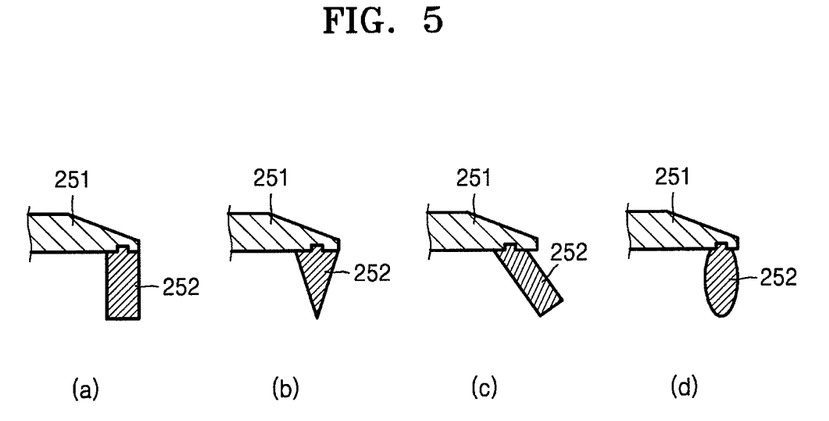
FIG. 5 is cross-sectional views of various examples of a protrusion portion illustrated in FIG. 4.

FIG. 3 is a conceptual view of an apparatus for manufacturing a display device 200 according to an embodiment. FIG. 4 is an enlarged cross-sectional view of portion A illustrated in FIG. 3. FIG. 5 is cross-sectional views of various examples of a protrusion portion illustrated in FIG. 4.

Referring to FIGS. 3 through 5, the apparatus for manufacturing the display device 200 may include a chamber 210, a guide unit or guider 230, a plasma spraying unit or plasma sprayer 240, a mask 250, a mask fixing unit or mask fixer 260, a pressure adjusting unit or pressure adjuster 270, and a location determination unit or location determination device 280.

The chamber 210 has a space inside and may include an opening 210a. Here, the opening 210a may include a door 220 to open and close the opening 210a.

The substrate 111 may be inserted and guided in the guide unit 230. Here, the guide unit 230 may be formed as a stage structure and may adjust a location of the substrate 111. Also, the guide unit 230 may be formed in the chamber 210 to be able to be lifted up and down.

The plasma spraying unit 240 may spray a plasma gas G onto the mask 250 and the substrate 111. Here, the plasma spraying unit 240 may generate the plasma gas G by applying currents to gas supplied from the outside to excite the gas to a plasma state and may supply the plasma gas G to the chamber 210. For example, the plasma spraying unit 240 may spray the plasma gas G onto an edge portion of the substrate 111.

The plasma spraying unit 240 may include a gas supplying unit 241 which supplies gas. Here, the gas may include a material having a fluorine (F) radical, such as $NF_3$ or $CF_3$, $N_2$, and $O_2$. The plasma spraying unit 240 may include a gas guiding unit 242 which is connected with the gas supplying unit 241 and the chamber 210 to guide the gas.

The plasma spraying unit 240 may include a plasma generating unit 243 formed in the gas guiding unit 242 and generating the plasma gas G by applying currents to gas passing through the gas guiding unit 242 to excite the gas to a plasma state. Here, in general, the plasma generating unit 243 may be formed of a pair of electrodes having polarities opposite to each other that generally form the plasma.

The mask 250 may be formed on the substrate 111. Here, the mask 250 may include a body portion 251 shielding the display area DA of the substrate 111. Also, the mask 250 may include a protrusion portion 252 formed to protrude from an end of the body portion 251 towards the display device 100.

The protrusion portion 252 may prevent the plasma gas G from flowing into a space between the substrate 111 and the body portion 251. For example, the protrusion portion 252 may be formed to wrap an edge of the body portion 251. Here, the protrusion portion 252 may be formed only on a portion which needs etching. For example, when only a first side surface of the substrate 111 needs etching, the protrusion portion 252 may be formed only on a first side surface of the body portion 251, which corresponds to the first side surface of the substrate 111. Also, when only a second side surface of the substrate 111 needs etching, the protrusion portion 252 may be formed only on a second side surface of the body portion 251, which corresponds to the second side surface of the substrate 111. Here, the first side surface and the second side surface may cross each other.

The protrusion portion 252 may be formed to be inclined. For example, the inclination of the protrusion portion 252 may be formed such that the protrusion portion 252 is more distanced apart from the body portion 251, in order from the body portion 251 to the substrate 111. That is, the protrusion portion 252 is formed to be inclined, and thus, the plasma gas G may be guided away from the display area DA of the substrate 111.

The protrusion portion 252 may be formed to have various shapes. For example, the protrusion portion 252 may have a cross-sectional surface which has a substantially quadrangular shape. Also, the protrusion portion 252 may have a cross-sectional surface which has a substantially triangular, oval, or circular shape. Also, the protrusion portion 252 may be formed to have a shape of a substantially inverted triangle. However, hereinafter, the description will be made in detail by focusing on the case in which the cross-sectional surface of the protrusion portion 252 has the quadrangular shape, for convenience of explanation. (refer to FIG. 5)

The protrusion portion 252 may be integrally formed with the body portion 251 or may be formed to be detachable from the body portion 251. Here, when the protrusion portion 252 is formed to be detachable from the body portion 251, an insertion groove 251a is formed in one of the protrusion portion 252 and the body portion 251 and the rest of the protrusion portion 252 and the body portion 251 may include an insertion protrusion 252a which is inserted into the insertion groove 251a. However, hereinafter, the description will be made in detail by focusing on the case in which the insertion groove 251a is formed in the body portion 251 and the insertion protrusion 252a is formed in the protrusion portion 252, for convenience of explanation.

The protrusion portion 252 may be formed of a different material from the body portion 251. In particular, the protrusion portion 252 may be formed of a material which is flexible and is etched little by the plasma gas G. For example, the protrusion portion 252 may be formed of a synthesis resin, such as teflon and peek. Here, fluorine coating may be performed on a surface of the protrusion portion 252 so that adhesion of the protrusion portion 252 and the substrate 111 may be consistently maintained for a long term.

Meanwhile, the mask fixing unit 260 may fix the mask 250. Here, the mask fixing unit 260 may be fixed by being connected with the mask 250 and may clamp the mask 250. However, hereinafter, the description will be made in detail by focusing on the case in which the mask fixing unit 260 is a frame simply fixing the mask 250, for convenience of explanation.

The pressure adjusting unit 270 may be connected with the chamber 210 and adjust an internal pressure of the chamber 210. Here, the pressure adjusting unit 270 may include a discharge pipe 271 connected to the chamber 210 and a vacuum pump 272 formed in the discharge pipe 271.

The location determination unit 280 may determine locations of the mask 250 and the substrate 111. Here, the location determination unit 280 may include a camera and may photograph locations of the mask 250 and the substrate 111 which are measured. For example, the location determination unit 280 may photograph an align mark formed on the mask 250 and an align mark formed on the substrate 111.

The apparatus for manufacturing the display device 200 may further include a control unit or controller 290. Here, the control unit 290 may include portable terminals, such as personal computers, notebook computers, and cellular phones.

The control unit 290 may control at least one of the guide unit 230, the plasma spraying unit 240, the mask fixing unit 260, and the pressure adjusting unit 270. Also, the control unit 290 may determine the locations of the mask 250 and the substrate 111 measured by the location determination unit 280, and based on this, may determine alignment between the mask 250 and the substrate 111.

In some embodiments, to consider a method of manufacturing the display device 100 by using the apparatus for manufacturing the display device 200, first, the TFT is formed on the substrate 111 and then the passivation layer 170 may be formed. Then, after the via-hole H2 is formed on the passivation layer 170, the pixel electrode 181 may be formed on the passivation layer 170. In addition, after the pixel-defining layer 190 is formed on the pixel electrode 181, the intermediate layer 182 including the organic emission layer may be deposited in an opening of the pixel-defining layer 190. Here, the intermediate layer 182 may be formed by using various methods. In particular, a method of evaporating an organic material, which is cost and time effective, may be used.

When the intermediate layer 182 is formed as illustrated above, since the intermediate layer 182 is sprayed to a space and is deposited on the pixel-defining layer 190, at least one material of the intermediate layer 182 may be deposited not only in the display area DA of the substrate 111 but also the non-display area NDA of the substrate 111.

Then, the sealing member 113 and the getter 114 may be formed in the non-display area NDA of the substrate 111.

When the sealing member 113 and the getter 114 are spread in the non-display area NDA of the substrate 111 as above, adhesion may be deteriorated due to the at least one material of the intermediate layer 182, which is deposited on the non-display area NDA. Thus, to solve this, after the intermediate layer 182 is formed or the opposite electrode 183 is formed on the intermediate layer 182, the at least one material of the intermediate layer 182 on the non-display area NDA may be removed by the apparatus for manufacturing the display device 200. However, hereinafter, the description will be made in detail by focusing on the case in which etching of the non-display area NDA by the apparatus for manufacturing the display device 200 is performed after the opposite electrode 183 is formed, for convenience of explanation.

For example, after the opposite electrode 183 is formed on the intermediate layer 182, the substrate 111 may be inserted into the chamber 210. Here, the opposite electrode 183 may be formed only in the display area DA of the substrate 111.

Then, the location determination unit 280 may photograph the align mark of the mask 250 and the align mark of the substrate 111 to transmit the photographed align marks to the control unit 290. The control unit 290 determines the locations of the substrate 111 and the mask 250 based on the photographed image, and may control at least one of the guide unit 230 and the mask fixing unit 260 to make the locations of the mask 250 and the substrate 111 correspond to each other. Here, the guide unit 230 may include the stage as described above to move the substrate 111 in a third direction.

When it is determined that the locations of the mask 250 and the substrate 111 are aligned as described above, the control unit 290 may supply the plasma gas G to the edge portion of the substrate 111 by the plasma spraying unit 240. Here, the plasma gas G may be sprayed around a connecting portion of the body portion 251 and the protrusion portion 252.

The plasma gas G may be guided into the non-display area NDA along outer surfaces of the body portion 251 and the protrusion portion 252. Here, the plasma gas G may etch and remove the at least one material of the intermediate layer 182, deposited in the non-display area NDA. Also, when the plasma gas G is sprayed, the pressure adjusting unit 270 may discharge an air in the chamber 210 to the outside.

In such a case, the protrusion portion 252 may prevent the plasma gas G from flowing into a space between the substrate 111 and the body portion 251. For example, the protrusion portion 252 is formed to protrude towards the substrate 111 from the body portion 251, and thus, the protrusion portion 252 may block a gap between the body portion 251 and the substrate 111. Thus, the plasma gas G may move to the non-display area NDA along the outer surfaces of the body portion 251 and the protrusion portion 252 and may not flow into the display area DA. Here, the intermediate layer 182 and the opposite electrode 183 may not be damaged by the plasma gas G.

For example, in such a case, when the plasma gas G flows into the space between the substrate 111 and the body portion 251, the plasma gas G may damage at least one of the opposite electrode 183 and the intermediate layer 182 formed on the substrate 111. The plasma gas G may cause dark sports or defects of bright spots by damaging the intermediate layer 182. Here, the protrusion portion 252 may fundamentally prevent the plasma gas G from flowing into the space between the body portion 251 and the substrate 111, thereby preventing the damage of the at least one of the opposite electrode 183 and the intermediate layer 182 by the plasma gas G.

When the above process is completed, the substrate 111 may be taken out of the chamber 210. Here, methods of taking out the substrate 111 may include using a robot arm, a conveyer, etc.

Thus, according to the apparatus for manufacturing the display device 200 and the method of manufacturing the display device 100, when the non-display area NDA is etched by the plasma gas G, it may be prevented that the plasma gas G penetrates the display area DA to damage at least one of the intermediate layer 182 and the opposite layer 183.

According to at least one of the disclosed embodiments, occurrences of the dark sports or defects of the bright spots due to the damage of the intermediate layer 182 or the opposite electrode 183 during the plasma etching, may be prevented, thereby minimizing the error rates.

It should be understood that the exemplary embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made herein without departing from the spirit and scope of the following claims.

What is claimed is:

1. A method of manufacturing a display device, the method comprising:
    inserting a substrate on which a display portion is formed on a display area into a chamber, wherein the display portion has top and bottom surfaces opposing each other, and a side surface interconnecting the top and bottom surfaces;
    placing a mask over the display area; and
    spraying plasma onto the substrate so as to etch a non-display area of the substrate,
    wherein the mask comprises:
    a body portion arranged over the display area and having first and second ends opposing each other; and
    a protrusion portion extending towards the substrate from the first and second ends of the body portion to prevent the plasma from flowing into the space between the substrate and the body portion, wherein the protrusion portion is configured to surround at least a portion of the side surface of the display portion, wherein the mask has upper and lower surfaces opposing each other, wherein the lower surface faces the display portion and the substrate, wherein each of the first and second ends of the body portion has upper and lower portions, wherein the protrusion portion extends from the lower portion of each end, and wherein the upper portion of each end is inclined with respect to the remaining portion of the upper surface of the mask.

2. The method of claim 1, wherein the protrusion portion has a cross-sectional surface which has a substantially triangular, oval, or circular shape.

3. The method of claim 1, wherein an insertion groove is formed in one of the first and second ends of the body portion and the protrusion portion, and wherein an insertion protrusion is formed on the other of the first and second ends of the body portion and the protrusion portion.

4. The method of claim 1, wherein the protrusion portion is formed of a flexible material.

5. The method of claim 1, wherein the etching of the non-display area is performed in a vacuum state.

6. The method of claim 1, wherein the protrusion portion does not overlap the display portion in the depth dimension of the display device, and wherein the protrusion portion overlaps the substrate in the depth dimension of the display device.

7. The method of claim 1, wherein the protrusion portion has a thickness greater than that of the display portion.

8. The method of claim 1, wherein a gap is formed between the mask and the display portion.

* * * * *